United States Patent
Nishigori et al.

(10) Patent No.: US 11,474,605 B2
(45) Date of Patent: Oct. 18, 2022

(54) VIBRATION PRESENTATION DEVICE AND VIBRATION PRESENTATION METHOD

(71) Applicant: SONY CORPORATION, Tokyo (JP)

(72) Inventors: Shuichiro Nishigori, Tokyo (JP); Shiro Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 460 days.

(21) Appl. No.: 16/343,938

(22) PCT Filed: Nov. 2, 2017

(86) PCT No.: PCT/JP2017/039694
§ 371 (c)(1),
(2) Date: Apr. 22, 2019

(87) PCT Pub. No.: WO2018/092595
PCT Pub. Date: May 24, 2018

(65) Prior Publication Data
US 2021/0294416 A1    Sep. 23, 2021

(30) Foreign Application Priority Data

Nov. 17, 2016 (JP) ............................ JP2016-224018

(51) Int. Cl.
*G06F 3/01* (2006.01)

(52) U.S. Cl.
CPC .............. *G06F 3/016* (2013.01); *G06F 3/014* (2013.01)

(58) Field of Classification Search
CPC ................................. G06F 3/016; G06F 3/014
USPC ...................................................... 340/407.1
See application file for complete search history.

(56) References Cited

U.S. PATENT DOCUMENTS

| 9,104,271 | B1 | 8/2015 | Adams et al. |
| 2006/0290662 | A1* | 12/2006 | Houston ................. A63F 13/06 345/156 |
| 2013/0056249 | A1 | 3/2013 | Taguchi et al. |
| 2013/0293494 | A1 | 11/2013 | Reshef |
| 2014/0245784 | A1 | 9/2014 | Proud et al. |
| 2014/0290834 | A1* | 10/2014 | Egron ..................... H01L 41/25 156/277 |

(Continued)

FOREIGN PATENT DOCUMENTS

| CN | 101785046 A | 7/2010 |
| CN | 102934047 A | 2/2013 |

(Continued)

OTHER PUBLICATIONS

Extended European Search Report of EP Application No. 20210178.8, dated Mar. 17, 2021, 04 pages.

(Continued)

*Primary Examiner* — Brian Wilson
(74) *Attorney, Agent, or Firm* — Chip Law Group (57) ABSTRACT

Provided is a vibration presentation device that includes a plurality of vibration actuators that vibrate when voltage is applied, and a control unit that controls vibration to be generated in the plurality of vibration actuators. The vibration actuators include a flexible, lightweight, and thin material, and are in surface contact with the portion to be presented with vibration. The control unit then generates a vibration signal for each of the plurality of vibration actuators, and controls the vibration for the plurality of vibration actuators independently of one another.

8 Claims, 10 Drawing Sheets

(56) References Cited

U.S. PATENT DOCUMENTS

| | | | |
|---|---|---|---|
| 2015/0287293 A1* | 10/2015 | Grant | G06F 3/016 340/407.1 |
| 2016/0175186 A1 | 6/2016 | Shadduck | |
| 2016/0288708 A1* | 10/2016 | Chang | G06V 20/597 |
| 2017/0020241 A1 | 1/2017 | Proud et al. | |
| 2017/0319430 A1 | 11/2017 | Shadduck | |
| 2018/0081439 A1* | 3/2018 | Daniels | G06F 1/163 |
| 2020/0012345 A1* | 1/2020 | Wang | G06F 3/017 |

FOREIGN PATENT DOCUMENTS

| | | |
|---|---|---|
| CN | 103120035 A | 5/2013 |
| CN | 104024987 A | 9/2014 |
| CN | 104094196 A | 10/2014 |
| CN | 104731319 A | 6/2015 |
| CN | 105045381 A | 11/2015 |
| CN | 105283122 A | 1/2016 |
| CN | 105677036 A | 6/2016 |
| CN | 105706148 A | 6/2016 |
| CN | 105718045 A | 6/2016 |
| CN | 106066698 A | 11/2016 |
| CN | 106092089 A | 11/2016 |
| EP | 2568778 A1 | 3/2013 |
| EP | 2927783 A1 | 10/2015 |
| JP | 2011-259162 A | 12/2011 |
| JP | 2015-197921 A | 11/2015 |
| KR | 10-2013-0036301 A | 4/2013 |
| KR | 10-2015-0114899 A | 10/2015 |
| WO | 2012/108502 A1 | 8/2012 |

OTHER PUBLICATIONS

International Search Report and Written Opinion of PCT Application No. PCT/JP2017/039694, dated Dec. 12, 2017, 07 pages of ISRWO.
Office Action for CN Patent Application No. 201780069594.3, dated Sep. 15, 2021, 9 pages of Office Action and 8 pages of English Translation.
Office Action for JP Patent Application dated Jun. 29, 2021.
Office Action for JP Patent Application No. 2018-551565, dated Jan. 25, 2022, 02 pages of English Translation and 03 pages of Office Action.

\* cited by examiner

VIBRATION PRESENTATION DEVICE AND VIBRATION PRESENTATION METHOD

CROSS REFERENCE TO RELATED APPLICATIONS

This application is a U.S. National Phase of International Patent Application No. PCT/JP2017/039694 filed on Nov. 2, 2017, which claims priority benefit of Japanese Patent Application No. JP 2016-224018 filed in the Japan Patent Office on Nov. 17, 2016. Each of the above-referenced applications is hereby incorporated herein by reference in its entirety.

TECHNICAL FIELD

The present disclosure relates to a vibration presentation device, a vibration presentation method, and a program, and more particularly, to a vibration presentation device, a vibration presentation method, and a program that enable generation of more preferred tactile stimulation.

BACKGROUND ART

In many conventional vibration presentation devices that present vibration to a user, the vibration actuators that generate vibration are eccentric motors, linear actuators, piezo actuators, voice coils, or the like, for example. Meanwhile, those vibration actuators mostly have a rectangular parallelepiped shape or a cylindrical shape with a certain thickness, and a hard metal is used as the material to form the vibration actuators.

Further, the range in which vibration is presented by a vibration presentation device is the area of the vibration actuators that vibrate. Therefore, to stimulate a wide range with a vibration presentation device, it is necessary to increase the size of the vibration actuators or to use a large number of joined actuators. However, a vibration presentation device that includes vibration actuators increased in size is considered inappropriate in terms of cost, weight, and the like. Therefore, a method using a large number of joined actuators is adopted in many cases.

However, by a method using a large number of joined actuators, hard vibration actuators are disposed in parallel. To attach the vibration actuators to a curved surface of a wrist, a finger, or the like, the vibration actuators are arranged at certain intervals. Therefore, the portions to be stimulated by the vibration actuators become discrete, and the range in which vibration can be presented is limited. Furthermore, in a configuration in which a plurality of vibration actuators are disposed, it is difficult in reality to attach the vibration actuators to a curved surface, due to an increase in weight, a decrease in the degree of adhesion between the vibration actuators and the vibration presenting surface, and the like.

On the other hand, piezoelectric films that are used in the transducers of a thin speaker or the like may be used as thin, lightweight actuators. However, since the power of a piezoelectric film are characteristically very low in the low frequency regions, it is difficult for piezoelectric films to generate sufficient power for vibratory stimulation, and therefore, piezoelectric films cannot be suitably used as vibration actuators.

For example, Patent Document 1 discloses a contact presentation device capable of presenting various contact states such as a line contact state and a surface contact state, by transmitting vibration with a vibration expansion unit provided around the actuators that generate vibration.

CITATION LIST

Patent Document

Patent Document 1: Japanese Patent Application Laid-Open No. 2008-134697

SUMMARY OF THE INVENTION

Problems to be Solved by the Invention

However, by the method disclosed in Patent Document 1 described above, there are differences in quality and quantity of vibratory stimulation between the actuators and the vibration expansion unit, and therefore, vibration might not be appropriately transmitted. For this reason, the stimulation generated by the vibration expansion unit at a distance from the actuators may become weak, and it is difficult to generate preferred tactile stimulation over a wide range of the human body.

The present disclosure is made in view of those circumstances, and aims to enable more preferred tactile stimulation.

Solutions to Problems

A vibration presentation device according to one aspect of the present disclosure includes: a plurality of vibration units that vibrate when voltage is applied; and a control unit that controls vibration to be generated in the plurality of vibration units. The vibration units include a flexible, lightweight, and thin material, and are in surface contact with the portion to be presented with vibration.

A vibration presentation method or a program according one aspect of the present disclosure includes the steps of: generating a vibration signal for each of the plurality of vibration units that include a flexible, lightweight, and thin material, and are in surface contact with the portion to be presented with vibration; and controlling vibration for the plurality of vibration units independently of one another.

In one aspect of the present disclosure, a plurality of vibration units that include a flexible, lightweight, and thin material and are in surface contact with the portion to be presented with vibration are caused to vibrate when voltage is applied thereto. A vibration signal is then generated for each of the plurality of vibration units, and the vibration is controlled independently for each of the plurality of vibration units.

Effects of the Invention

According to one aspect of the present disclosure, more preferred tactile stimulation can be generated.

MODES FOR CARRYING OUT THE INVENTION

The following is a detailed description of specific embodiments to which the present technology is applied, with reference to the drawings.

<Basic Structure of a Vibration Actuator>

Figure 1:
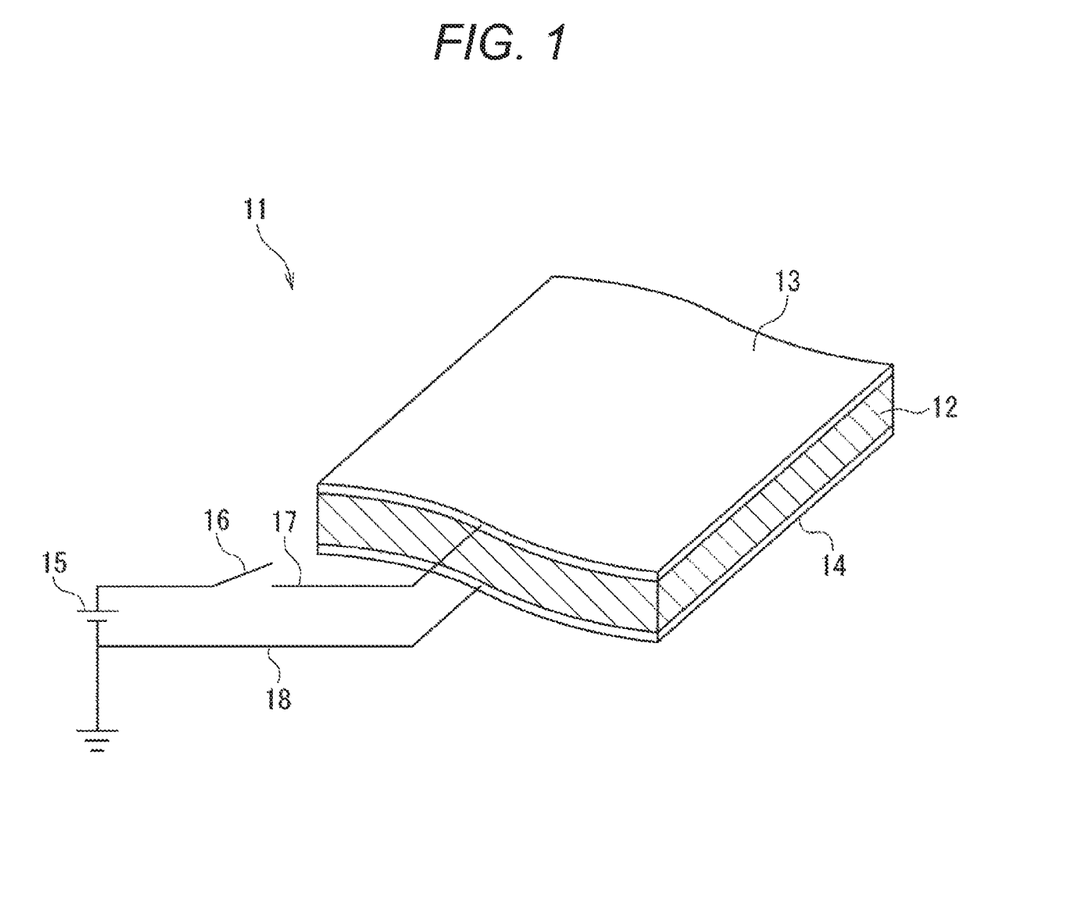
FIG. 1 is a diagram for explaining the basic structure of a vibration actuator.

FIG. 1 is a diagram for explaining an example configuration of a vibration actuator.

As shown in FIG. 1, a vibration actuator 11 includes a dielectric layer 12, electrodes 13 and 14, a power supply 15, and a switch 16. Further, the vibration actuator 11 has a connection configuration in which a conductive wire 17 is connected to the electrode 13, the conductive wire 17 is connected to the power supply 15 via the switch 16, a conductive wire 18 is connected to the electrode 14, and the conductive wire 18 is connected to the power supply 15.

The dielectric layer 12 is formed with a flexible material that expands and contracts when voltage is applied thereto. Meanwhile, the electrodes 13 and 14 are electrically connected to both surfaces of the dielectric layer 12, and the electrodes 13 and 14 apply voltage to the dielectric layer 12. Further, the material of the dielectric layer 12 is formed from a composition containing metal oxide particles having a hydroxyl group, a rubber polymer having a functional group capable of reacting with an epoxy group, a bisphenol epoxy resin having an epoxy group at either end, and a cross-linking agent, as disclosed in Japanese Patent Laid-Open No. 2016-69511, for example.

The electrodes 13 and 14 are made of a flexible material having conductive properties, and constitute a laminated structure sandwiching the dielectric layer 12. The electrodes 13 and 14 are also coated with an insulating coating on the outer surfaces on the opposite sides from the inner sides sandwiching the dielectric layer 12. Thus, even if there is contact with the human body, for example, electric current does not flow on the human body side.

The power supply 15 is formed with a battery that accumulates electric power, for example, and applies voltage to the electrodes 13 and 14 to cause vibration generation by the vibration actuator 11.

The switch 16 switches on and off the voltage to be applied to the electrodes 13 and 14, and appropriately causes vibration generation by the vibration actuator 11.

In the vibration actuator 11 having the above configuration, when the voltage of the power supply 15 is applied to the dielectric layer 12 from the electrodes 13 and 14, the dielectric layer 12 expands and contracts vertically and horizontally, to generate vibration. The vibration generated in the vibration actuator 11 then stimulates the tactile sense of the human body through the surfaces of the electrodes 13 and 14. For example, the dielectric layer 12 and the electrodes 13 and 14 include a flexible, lightweight, and thin material such as elastomer, and can be in surface contact with a point to which vibration is to be presented. With this configuration, the vibration actuator 11 can present a wide range of vibration, and generate more preferred tactile stimulation than in conventional cases.

Further, the dielectric layer 12 and the electrodes 13 and 14 can easily deform so that the shape can be bent by virtue of the flexibility of its material, and increase the degree of adhesion to the human body, for example.

Figure 2:
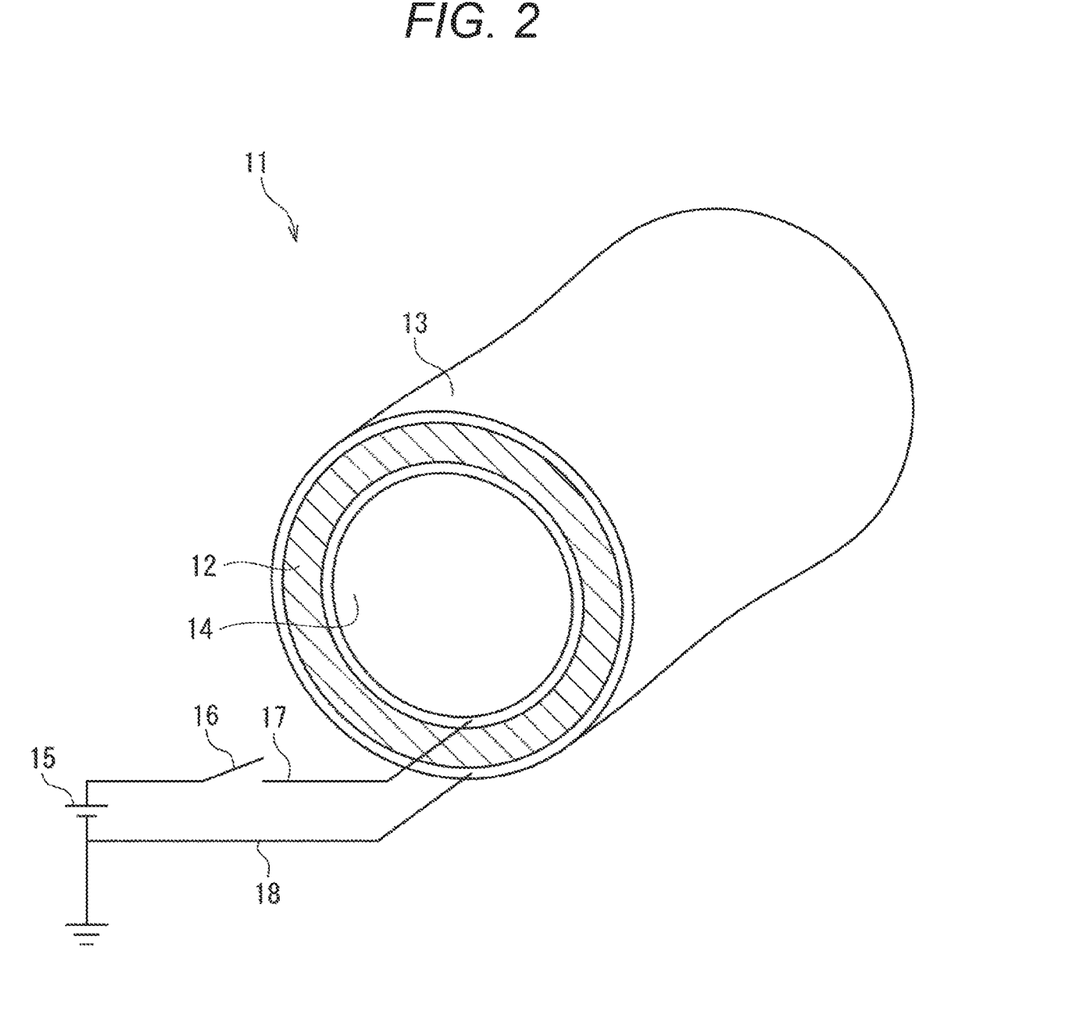
FIG. 2 is a diagram showing a configuration example of a vibration actuator shaped into a tubular form.

For example, the vibration actuator 11 can be shaped into a tubular form having an inner cavity, as shown in FIG. 2.

The vibration actuator 11 shown in FIG. 2 has a laminated structure in which the electrodes 13 and 14 sandwich the dielectric layer 12 as in FIG. 1, the electrode 13 is electrically connected to the outer peripheral surface of the dielectric layer 12, and the electrode 14 is electrically connected to the inner peripheral surface of the dielectric layer 12. Further, the connecting structure for connecting the power supply 15 to the electrodes 13 and 14 is also similar to that in FIG. 1.

The vibration actuator 11 having a tubular form as described above is wrapped around a finger, a wrist, or the like, or having a finger inserted thereinto, so that the vibration actuator 11 can present vibration to an entire finger or wrist.

Note that the vibration actuator 11 having a tubular form can be designed so that its entire surface serves as a vibrating surface, for example. Alternatively, the vibration actuator 11 having a tubular form can be attached to a casing molded into a tubular form or a belt-like form with silicon or the like, for example, so that the vibrating surface is formed only for the necessary portion, such as the ball of a finger or the back of a wrist.

In the embodiments described below, vibration presentation devices using the vibration actuator 11 having a tubular form as shown in FIG. 2 will be explained.

First Example Configuration of a Vibration Presentation Device

Figure 3:
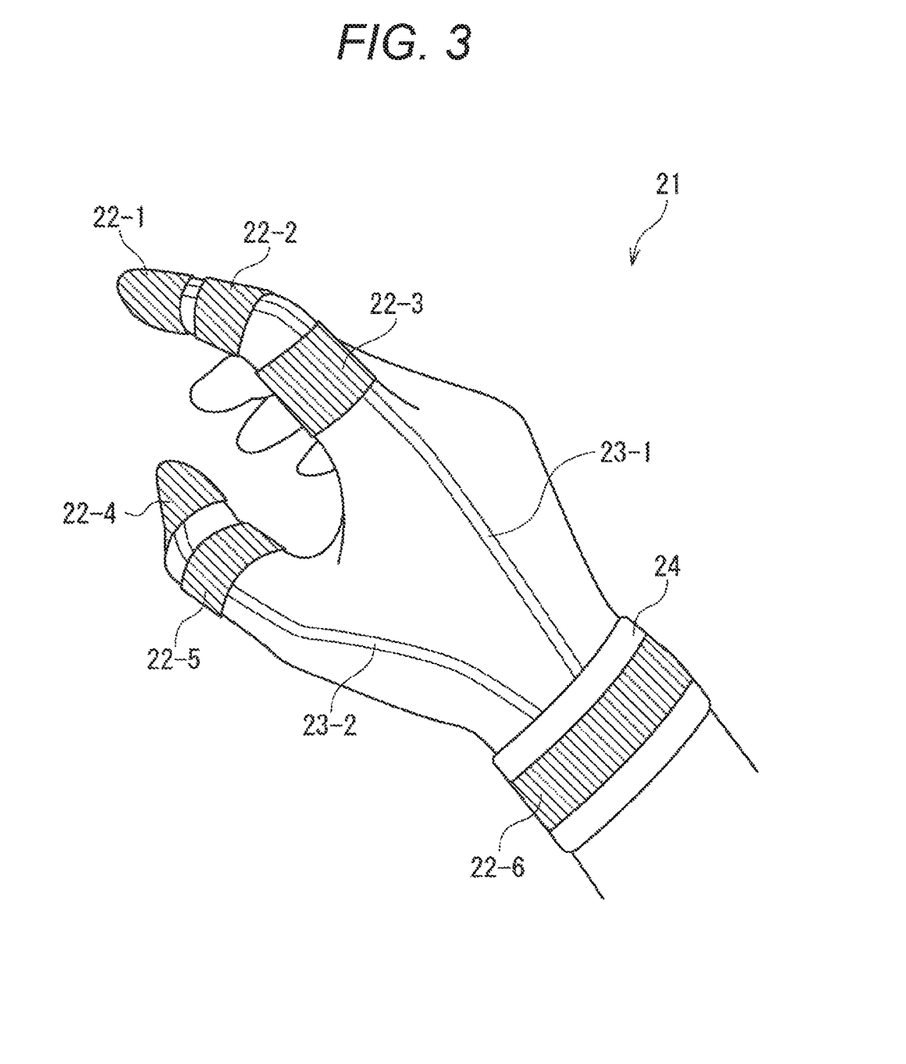
FIG. 3 is a diagram showing an example configuration of a first embodiment of a vibration presentation device to which the present technology is applied.

FIG. 3 is a diagram showing an example configuration of a first embodiment of a vibration presentation device to which the present technology is applied.

FIG. 3 shows a vibration presentation device 21 of a type to be worn on a user's hand. The vibration presentation device 21 includes six vibration actuators 22-1 through 22-6, conductive wires 23-1 and 23-2, and a control unit 24.

Like the vibration actuator 11 described above with reference to FIGS. 1 and 2, the vibration actuators 22-1 through 22-6 each have a laminated structure in which the electrodes 13 and 14 sandwich the dielectric layer 12. In other words, the vibration actuators 22-1 through 22-6 are designed so that the dielectric layer 12 vibrates when voltage is applied to the electrodes 13 and 14, to generate vibration. The vibration actuators 22-1 through 22-6 can also be formed in shapes corresponding to the respective mounting positions, by virtue of the flexibility of the dielectric layer 12 and the electrodes 13 and 14.

For example, the vibration actuator 22-1 is shaped into such a tubular form as to cover the portion from the tip to the first joint of the index finger. Meanwhile, the vibration actuator 22-2 is shaped into such a tubular form as to cover the portion from the first joint to the second joint of the index finger, and the vibration actuator 22-3 is shaped into such a tubular form as to cover the portion from the second joint to the base of the index finger. Likewise, the vibration actuator 22-4 is shaped into such a tubular form as to cover the portion from the tip to the first joint of the thumb, and the vibration actuator 22-5 is shaped into such a tubular form as to cover the portion from the first joint to the second joint of the thumb. Further, the vibration actuator 22-6 is shaped into a belt-like form to be wound around the wrist.

The conductive wire 23-1 connects the vibration actuator 22-1, the vibration actuator 22-2, and the vibration actuator 22-3 to the control unit 24. Meanwhile, the conductive wire 23-2 connects the vibration actuator 22-4 and the vibration actuator 22-5 to the control unit 24.

The control unit 24 has a shape like a wrist band to be wrapped around the wrist of the user. In addition to the power supply 15, the switch 16, and the like shown in FIGS. 1 and 2, the control unit 24 includes a vibration data reception unit, a vibration signal control unit, a vibration signal amplification unit, and the like, for example. The control unit 24 then controls vibrations of the vibration actuator 22-1, the vibration actuator 22-2, and the vibration actuator 22-3 via the conductive wire 23-1, and controls vibrations of the vibration actuator 22-4 and the vibration actuator 22-5 via the conductive wire 23-2.

For example, the control unit 24 can control vibrations generated in the vibration actuators 22-1 through 22-6 independently of one another. The control unit 24 can then generate tactile stimulation such that vibration is moving from the fingertip toward the wrist, for example, by appropriately controlling the timings, the frequencies, the intensities, and the like of the vibrations. Note that the configuration of the control unit 24 will be described later in detail with reference to FIG. 4.

In this manner, the vibration presentation device 21 is designed so that the vibration actuators 22-1 through 22-6 can be attached to and in contact with a hand of a user at a plurality of portions. With this design, the vibration presentation device 21 can be used in a vibration presentation system for realizing tactile feedback in virtual reality (VR), for example. Specifically, the user is made to experience, in VR, a shock to be felt when the user shoots a gun, a tactile sensation to be felt when the user touches an object, a sense of force to be felt when the user grasps an object, and the like as virtual tactile sensation through vibrations presented to fingers and a wrist. Thus, the vibration presentation device 21 can increase the realistic feeling in VR.

Example Configuration of a Vibration Presentation System

Figure 4:
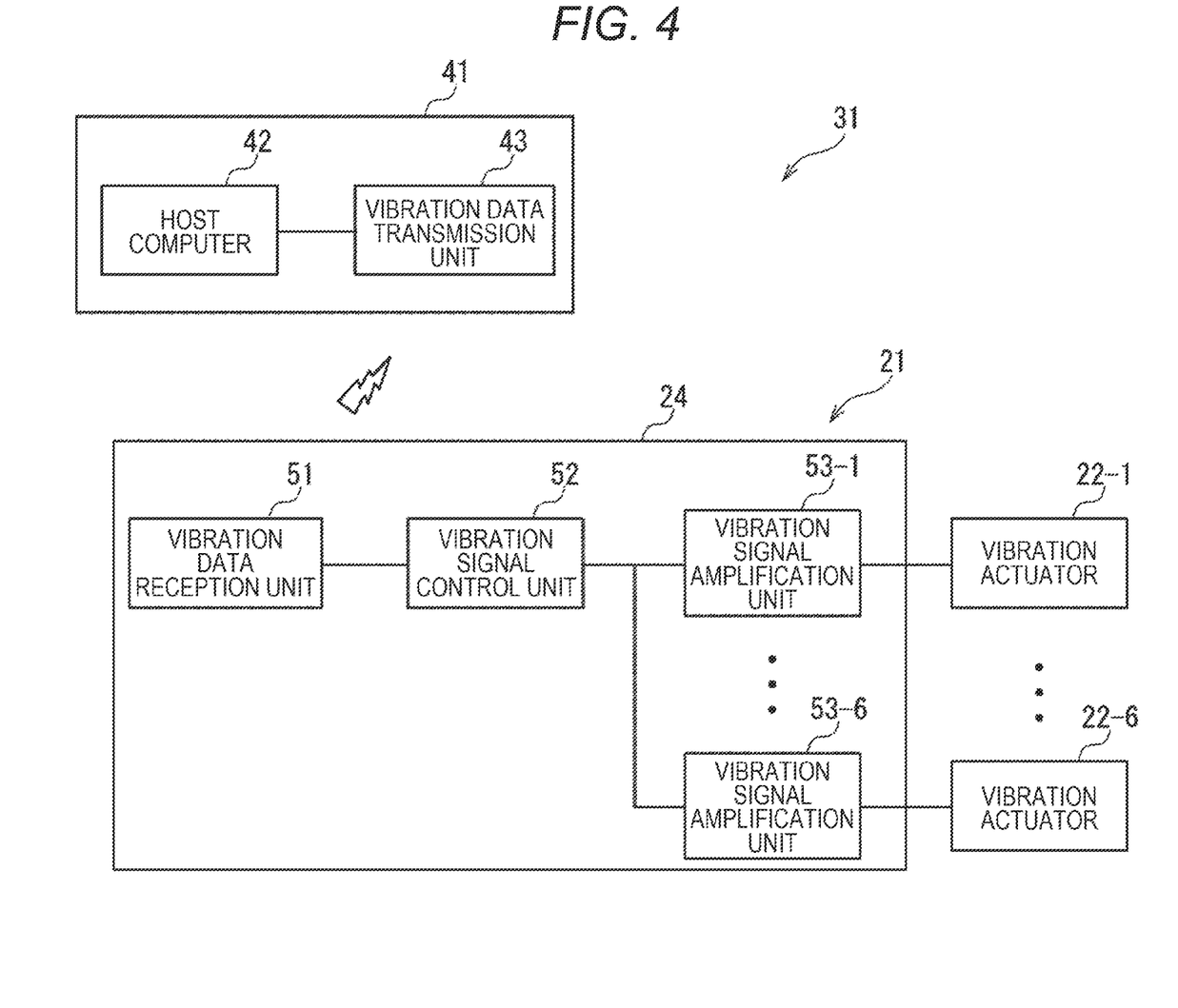
FIG. 4 is a diagram showing an example configuration of a vibration presentation system.

Referring now to FIG. 4, an example configuration of a vibration presentation system using the vibration presentation device 21 shown in FIG. 3 is described.

As shown in FIG. 4, a vibration presentation system 31 includes the vibration presentation device 21 and a content execution processing device 41. As shown in FIG. 3, the vibration presentation device 21 includes the vibration actuators 22-1 through 22-6 and the control unit 24.

For example, the content execution processing device 41 performs a process of executing content for reproducing VR as described above, content for operating a robot existing in a remote place, or the like, and includes a host computer 42 and a vibration data transmission unit 43.

The host computer 42 serves as a server that transmits vibration data for stimulating the user's tactile sense in accordance with execution of content. For example, in a case where content for reproducing VR is executed, the host computer 42 encodes vibration signals prepared beforehand by the content creator, and holds the encoded vibration signals as a file. At a time when tactile feedback is required, the host computer 42 can read the vibration signals, and transmit the encoded vibration data. Further, in a case where content for operating a robot existing in a remote place is executed, the host computer 42 can transmit vibration data obtained by encoding, in real time, vibration information acquired by a sensor. Note that, other than the use of the vibration data encoded in this manner, the vibration signals can be used as the vibration data, if the communication channel is wide.

The vibration data transmission unit 43 includes an encoder for wirelessly transmitting the vibration data supplied from the host computer 42, a packet division unit, a buffer control unit, and a transmission radio frequency (RF) antenna module.

The control unit 24 includes a vibration data reception unit 51, a vibration signal control unit 52, and vibration signal amplification units 53-1 through 53-6. Note that the control unit 24 also includes the power supply 15 and the switch 16 shown in FIG. 1.

The vibration data reception unit 51 includes a reception RF antenna module, a packet reception unit, and a buffer control unit, for example. The vibration data reception unit 51 receives the vibration data wirelessly transmitted from the vibration data transmission unit 43, and supplies the vibration data to the vibration signal control unit 52.

The vibration signal control unit 52 includes a decoder that decodes the encoded vibration data into vibration signals. For example, the vibration signal control unit 52 generates vibration signals for generating tactile stimulation for the respective sites (the respective portions of the fingers and the wrist) shown in FIG. 3. In accordance with the vibration actuators 22-1 through 22-6 to be vibrated with the generated vibration signals, the vibration signal control unit 52 then selects the corresponding vibration signal amplification units 53-1 through 53-6, and supplies the vibration signals.

The vibration signal amplification units 53-1 through 53-6 each include a power amplifier circuit that amplifies a vibration signal, and transmits the amplified vibration signals to the vibration actuators 22-1 through 22-6.

The vibration presentation device 21 configured as described above controls the vibrations of the respective vibration actuators 22-1 through 22-6 in accordance with the vibration signals obtained by decoding the vibration data received by the vibration data reception unit 51. Thus, the vibration presentation device 21 can present a desired vibratory stimulation to the fingers and the wrist.

With this configuration, the vibration presentation device 21 can transmit vibration gradually from the base to the tip of a finger, for example, by virtue of the vibration actuators 22-1 through 22-6 mounted independently for the respective joints of the fingers. Accordingly, the vibration presentation device 21 can provide a feeling of movement and a feeling of propagation, and generate more preferred tactile stimulation.

Further, when being used for tactile feedback during operation under bidirectional remote control, for example, the vibration presentation system 31 can control a robot existing in a remote place and generate tactile stimulation as if to check the feel of the object being touched by the robot.

Specifically, instead of actuators, triaxial acceleration sensors, pressure sensors, or the like may be mounted on the robot hand in a remote place, and those sensors may be arranged similarly to the vibration actuators 22-1 through 22-6. In addition, when an object is touched by the robot hand in the remote place, signals read with those sensors are transmitted as vibration signals to the vibration presentation device 21 via a network, and the vibrations are then reproduced by the vibration actuators 22-1 through 22-6. Thus, the vibration presentation system 31 can be used for checking the feel of an object in a case where the person cannot actually go to the location of the object, for example.

Note that, although FIG. 3 shows the vibration presentation device 21 of the example configuration in which the vibration actuators 22 are attached to the index finger, the thumb, and the wrist, the vibration actuators 22 may be attached to the other fingers, the back of the hand, or the like, as necessary. Alternatively, the vibration presentation device 21 can be incorporated into the inside of a glove-type device, and be used.

Figure 5:
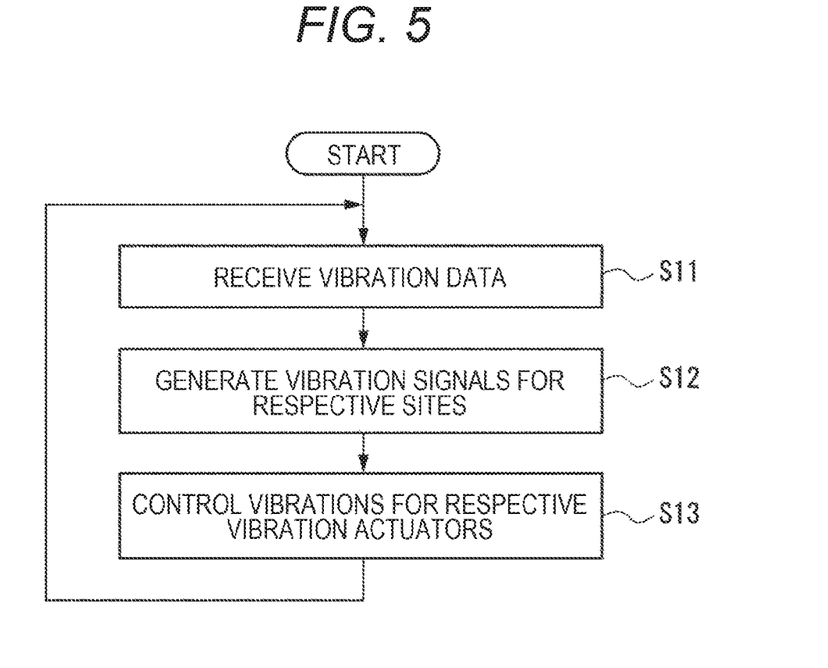
FIG. 5 is a flowchart for explaining a vibration presentation method.

FIG. 5 is a flowchart for explaining a vibration presentation method implemented by the vibration presentation device 21.

For example, the process is started when vibration data is transmitted from the vibration data transmission unit 43 in FIG. 4. In step S11, the vibration data reception unit 51 receives the vibration data and supplies the vibration data to the vibration signal control unit 52.

In step S12, the vibration signal control unit 52 decodes the vibration data supplied from the vibration data reception unit 51 in step S11, appropriately generates vibration signals for respective sites as shown in FIG. 3, and supplies the vibration signals to the vibration signal amplification units 53-1 through 53-6.

In step S13, the vibration signal amplification units 53-1 through 53-6, to which the vibration signals have been supplied from the vibration signal control unit 52 in step S12, amplify the vibration signals and supply the vibration signals to the vibration actuators 22-1 through 22-6. Thus, the vibrations are controlled for the respective vibration actuators 22-1 through 22-6.

After that, the process returns to step S11, to wait until the next vibration data is transmitted from the vibration data transmission unit 43. Thereafter, a process similar to the above is repeated until the content being executed by the content execution processing device 41 comes to an end.

As described above, the vibration presentation device 21 can control vibrations for the respective vibration actuators 22-1 through 22-6, and present the user with a vibratory stimulation moving from a fingertip to the wrist, for example.

Second Example Configuration of a Vibration Presentation Device

Figure 6:
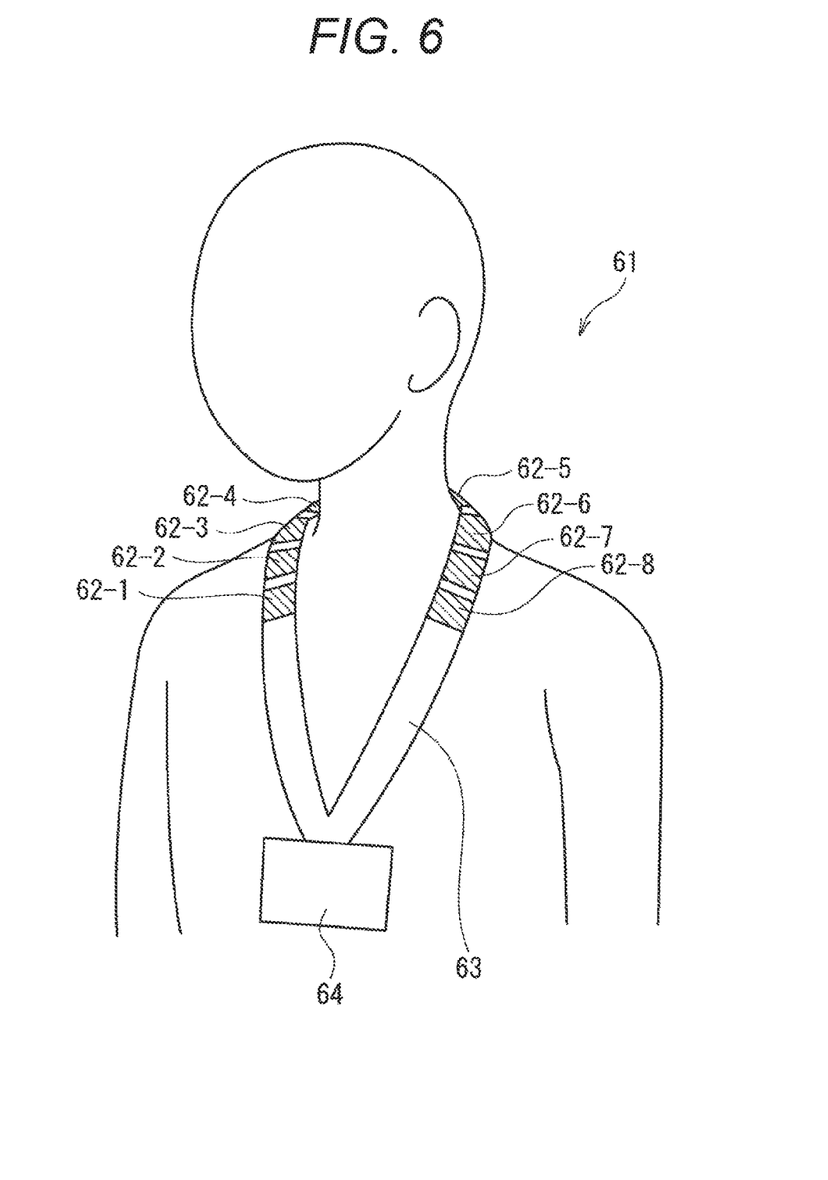
FIG. 6 is a diagram showing an example configuration of a second embodiment of a vibration presentation device.

FIG. 6 is a diagram showing an example configuration of a second embodiment of a vibration presentation device.

FIG. 6 shows a neck-strap-type vibration presentation device 61 hanging from a user's neck. The vibration presentation device 61 includes eight vibration actuators 62-1 through 62-8, a strap 63, and a control unit 64.

The vibration actuators 62-1 through 62-8 are mounted so as to surround the portion of the vibration presentation device 61 to be in contact with the human body, or the portion from the back of the neck to the periphery of the sternum. As described above with reference to FIG. 2, each of the vibration actuators 62-1 through 62-8 can have its entire cylindrical surface designed as a vibrating surface, and, even if the strap is twisted, the vibrating surface is in contact with the neck.

The strap 63 is shaped into the form of a hollow tube, and conductive wires 17 and 18 (see FIG. 2) are provided inside the strap 63, to connect the vibration actuators 62-1 through 62-8 to the control unit 64.

As described above with reference to FIG. 4, the control unit 64 includes a vibration data reception unit 51, a vibration signal control unit 52, and vibration signal amplification units 53-1 through 53-8, and the conductive wires 17 and 18 (see FIG. 2) for transmitting vibration signals are connected to the control unit 64.

In the vibration presentation device 61 configured as above, the control unit 64 controls vibrations for the respective vibration actuators 62-1 through 62-8, so that a desired vibratory stimulation can be given to the periphery of the neck. Note that the vibration presentation device 61 can be worn and used by the user at the same time as the vibration presentation device 21 shown in FIG. 3, and vibrations can be presented by a combination thereof.

For example, the vibration presentation device 61 can also be used as a means for enhancing the bodily sensation of basses when the user is listening to music through headphones. In other words, as the vibration actuators 62-1 through 62-8 reproduce only low-frequency signals such as music signals at lower than 100 Hz, the vibration presentation device 61 can enable more powerful music appreciation experiences.

The vibration presentation device 61 can also be used for navigation. For example, the vibration actuators 62-1 through 62-8 are made to appropriately vibrate at respective branch points when guiding a user through a route by navigation, so that the person wearing the device can be instructed about directions without hearing and seeing.

For example, in a case where an instruction to move leftward is to be issued, the vibration actuators 62-1 through 62-8 are sequentially made to vibrate, starting from the vibration actuator 62-1 to the vibration actuator 62-8. Thus, the vibration presentation device 61 can make the user to notice the instruction for leftward movement. Conversely, in a case where an instruction to move rightward is to be issued, the vibration actuators 62-1 through 62-8 are sequentially made to vibrate, starting from the vibration actuator 62-8 to the vibration actuator 62-1. Thus, the vibration presentation device 61 can make the user to notice the instruction for rightward movement. Further, in a case where an instruction to move straight ahead is to be issued, control is performed so that vibration is sequentially caused in the direction from the vibration actuator 62-1 toward the vibration actuator 62-4, and in the direction from the vibration actuator 62-8 toward the vibration actuator 62-5. Also, in a case where an instruction to move backward is to be issued, control is performed so that vibration is sequentially caused in the direction from the vibration actuator 62-4 toward the vibration actuator 62-1, and in the direction from the vibration actuator 62-5 toward the vibration actuator 62-8.

Furthermore, in a case where the user is about to move in a wrong direction, the vibration presentation device 61 can draw attention of the user by prompting the user to move in the opposite direction through a stronger stimulation.

Third Example Configuration of a Vibration Presentation Device

Figure 7:
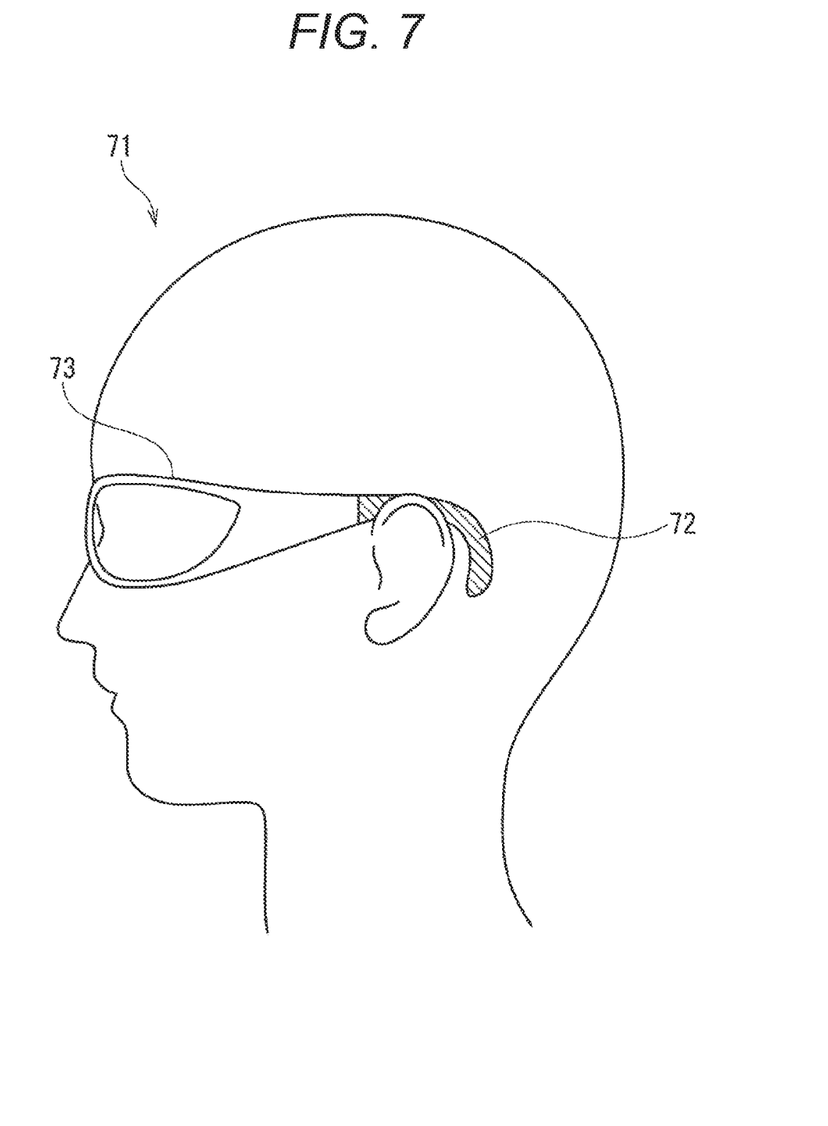
FIG. 7 is a diagram showing an example configuration of a third embodiment of a vibration presentation device.

FIG. 7 is a diagram showing an example configuration of a third embodiment of a vibration presentation device.

FIG. 7 shows a vibration presentation device 71 in the form of augmented reality (AR) eyeglasses to be worn like eyeglasses by a user. The vibration presentation device 71 is formed by attaching vibration actuators 72 to an AR eyeglass device 73. Note that, although FIG. 7 shows only the vibration actuator 72 covering the portion of the temple on the left ear side, the vibration presentation device 71 is formed by attaching the vibration actuator 72 (not shown) so as to cover the portion of the temple on the opposite side (the right ear side).

The AR eyeglass device 73 has a built-in display device that displays an image in front of the eyes of the user, and is a general AR device that displays a video image in accordance with AR content being reproduced. Further, a vibration data reception unit 51, a vibration signal control unit 52, and vibration signal amplification units 53-1 and 53-2 as described above with reference to FIG. 4 are incorporated into the AR eyeglass device 73, and are connected to the right and left vibration actuators 72.

The vibration presentation device 71 configured as described above can provide a desired vibratory stimulation to the head, by controlling vibrations of the respective vibration actuators 72 attached to the temple portions on both sides of the AR eyeglass device 73.

For example, the vibration presentation device 71 presents vibrations generated by the vibration actuators 72, as well as displaying on the display device notifications such as warnings and information presentation that are generated during operation of the AR eyeglass device 73. Thus, it should become more easily draw attention. Further, in a case where the user is closing his/her eyes, it is very effective that the vibration presentation device 71 presents vibrations with the vibration actuators 72.

The vibration presentation device 71 also controls vibration signals of the right and left vibration actuators 72 independently of each other, so that the rightward and leftward directions can be presented like the vibration presentation device 61 of the neck strap type shown in FIG. 6. Furthermore, the vibration presentation device 71 can properly switch notification patterns by changing the interval, the strength, and the like at which the vibration actuators 72 are made to vibrate.

Further, in the vibration presentation device 71, even if vibration occurs at a site on the rim of the AR eyeglass device 73, the user is not bothered. As the vibration actuators 72 are disposed at the ear portions having high tactile sensitivity, it is also possible for the user to sense a relatively small vibration. Thus, the vibration presentation device 71 can be used more comfortably with low power consumption.

Fourth Example Configuration of a Vibration Presentation Device

Figure 8:
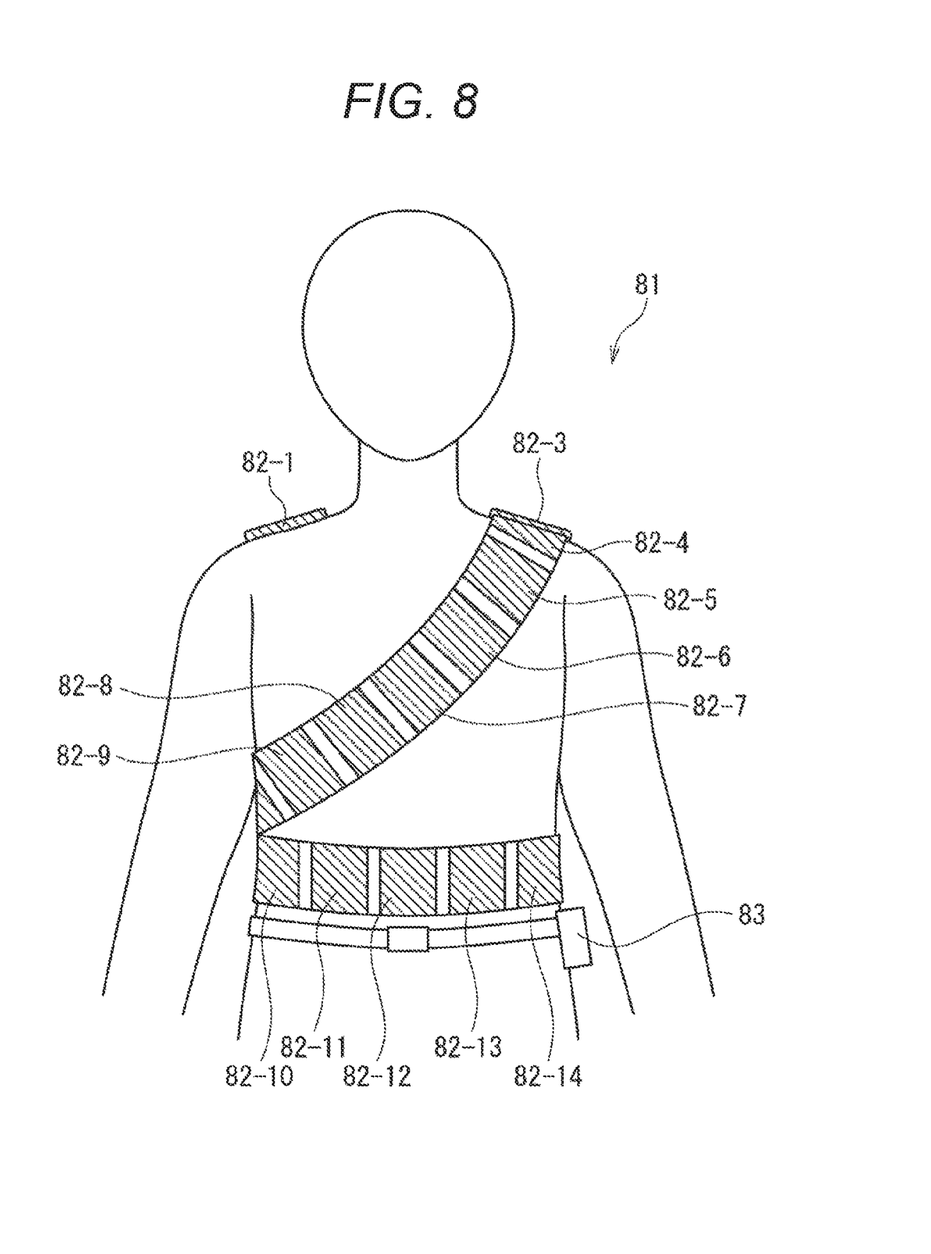
FIG. 8 is a diagram showing an example configuration of a fourth embodiment of a vibration presentation device.

FIG. 8 is a diagram showing an example configuration of a fourth embodiment of a vibration presentation device.

FIG. 8 shows a wear-type vibration presentation device 81 to be worn by a user. The vibration presentation device 81 includes 14 vibration actuators 82-1 through 82-14 and a control unit 83.

The vibration actuators 82-1 and 82 are attached to the shoulder portions of a user wearing the wear-type vibration presentation device 81. Meanwhile, the vibration actuators 82-3 through 82-9 are attached diagonally from a shoulder to a side of the user wearing the wear-type vibration presentation device 81. Further, the vibration actuators 82-10 through 82-14 are attached like a belt around the abdomen of the user wearing the wear-type vibration presentation device 81.

The control unit 83 includes a vibration data reception unit 51, a vibration signal control unit 52, and vibration signal amplification units 53-1 through 53-14 as described with reference to FIG. 4, and is connected to the vibration actuators 82-1 through 82-14. For example, conductive wires 17 and 18 (see FIG. 2) for transmitting vibration signals to the vibration actuators 82-1 through 82-14 are designed to be integrated on the back of the user and are connected to the control unit 83.

In this manner, the vibration presentation device 81 is designed so that the vibration actuators 82-1 through 82-14 can be attached to and in contact with the body of the user at a plurality of portions. In the vibration presentation device 81, the control unit 83 then controls vibrations for the respective vibration actuators 82-1 through 82-14, so that a desired vibratory stimulation can be given to the body of the user.

For example, the vibration presentation device 81 may be used in attractions such as amusement facilities. Specifically, in an attraction such as a horror house and a battle game, the vibration presentation device 81 causes the vibration actuators 82-1 and 82, to give the user a feeling as if someone were tapping the user's shoulders, leaning on the user's shoulders, or putting hands on the user's shoulders.

The vibration presentation device 81 also causes one of the vibration actuators 82-3 through 82-14, to generate a feeling as if the user were shot with a gun. Further, the vibration presentation device 81 causes the vibration actuators 82-3 through 82-9 to vibrate sequentially in a diagonal direction from the upper side toward the lower side, to give the user a feeling as if he/she were attacked with a sword that is diagonally swung. Likewise, the vibration actuators 82-10 through 82-14 are caused to vibrate sequentially in a direction from either the left or the right, so that the user can feel as if he/she were attacked at the abdomen with a sword.

Fifth Example Configuration of a Vibration Presentation Device

Figure 9:
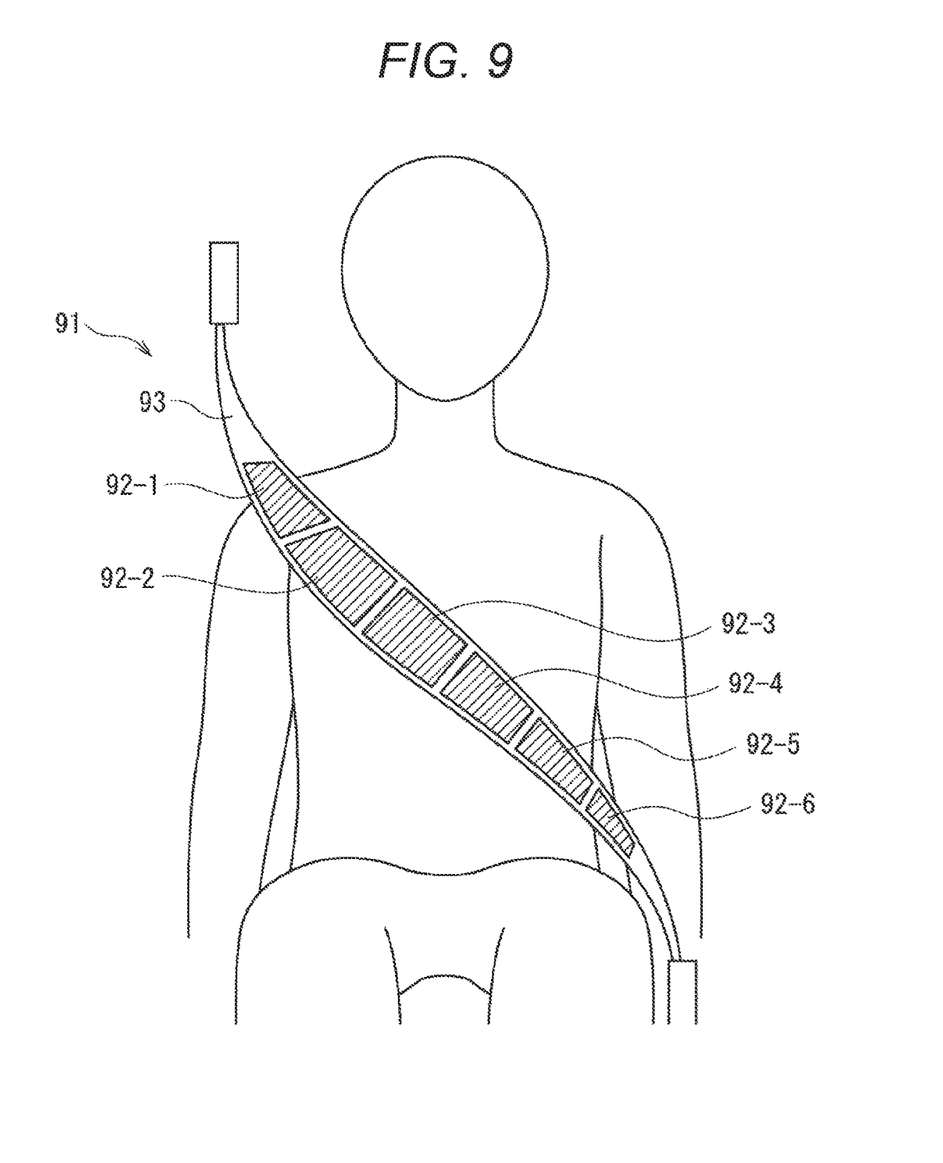
FIG. 9 is a diagram showing an example configuration of a fifth embodiment of a vibration presentation device.

FIG. 9 is a diagram showing an example configuration of a fifth embodiment of a vibration presentation device.

FIG. 9 shows a seat-belt-type vibration presentation device 91 to be used in an automobile. The vibration presentation device 91 includes six vibration actuators 92-1 through 92-6 and a belt 93.

The belt 93 is a seat belt installed in a general automobile, and the vibration actuators 92-1 through 92-6 are attached to the belt 93. Further, conductive wires 17 and 18 (see FIG. 2) for transmitting vibration signals to the vibration actuators 92-1 through 92-6 are disposed along the belt 93, are connected to a control device installed in the automobile. This control device includes a vibration data reception unit 51, a vibration signal control unit 52, and vibration signal amplification units 53-1 through 53-6 as described above with reference to FIG. 4.

In the vibration presentation device 91 configured as above, vibration is controlled for each of the vibration actuators 92-1 through 92-6, so that a stimulation can be given to the portion from a shoulder base toward a side of the human body through vibration, for example.

For example, the vibration presentation device 91 may be mainly used for preventing dozing off while driving. For example, drowsiness tends to be readily induced during semi-automatic driving or the like as well as during regular automobile driving, because it does not require much power of concentration. To prevent such drowsy driving, it is possible to stimulate the driver with sound, light, or the like.

However, such a stimulation is unpleasant to the other passenger(s), and therefore, it is preferable to wake up the driver through vibration.

When detecting drowsy driving with a sensor (not shown) that detects drowsy driving or the like, the vibration presentation device 91 causes the vibration actuators 92-1 through 92-6 to vibrate violently in either an upward direction or a downward direction. By doing so, the vibration presentation device 91 can give a different stimulation with the vibration actuators 92-1 through 92-6 from the vibration during normal driving, and thus, the driver easily wakes up. Further, in the vibration presentation device 91, the vibration actuators 92-1 through 92-6 are distributed over a wide range, and thus, vibration can be felt in any position. Furthermore, the vibration actuators 92-1 through 92-6 are thin, and accordingly, the vibration presentation device 91 has a thickness that is almost the same as the thickness of a conventional seat belt. Thus, the vibration presentation device 91 can be handled in a preferred manner.

As described above, a vibration presentation device of any of the above embodiments is capable of presenting vibrations over a wide range, and can stimulate the tactile sense existing at various sites in a wide area of the human body, which has been difficult to achieve with conventional techniques. Further, in the vibration presentation device of any of the above embodiments, it is possible to bring the vibration actuators into close contact with a curved surface, and thus, vibration sensitivity can be improved. Furthermore, a plurality of vibration actuators can be arranged at very short intervals and be controlled independently of one another. Thus, it is possible to smoothly present moves, such as movement and propagation of a tactile stimulation.

Example Configuration of a Computer

Note that the respective processes described above with reference to the flowcharts are not necessarily carried out in chronological order in accordance with the sequences shown as the flowcharts, but include procedures to be carried out in parallel or independently of one another (such as parallel procedures or object-based procedures, for example). Meanwhile, a program may be executed by one CPU, or may be executed in a distributive manner by a plurality of CPUs.

Further, the above described series of processes (vibration presentation methods) can be performed by hardware, or can also be performed by software. In a case where the series of processes are performed by software, the program that forms the software may be installed in a computer incorporated into special-purpose hardware, or may be installed from a program recording medium into a general-purpose personal computer or the like that can execute various kinds of functions by installing various kinds of programs, for example.

Figure 10:
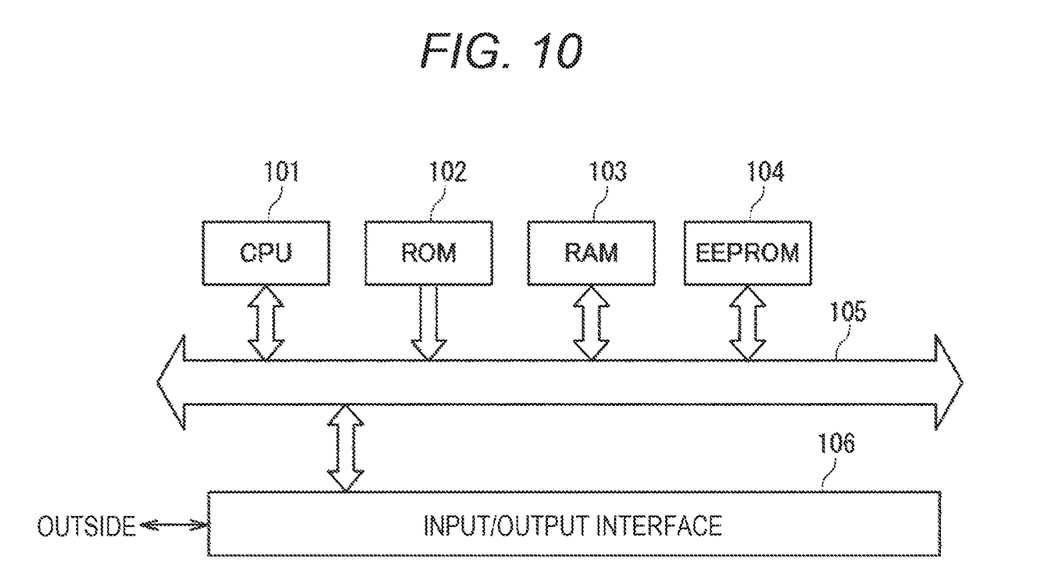
FIG. 10 is a block diagram showing an example configuration of an embodiment of a computer to which the present technology is applied.

FIG. 10 is a block diagram showing an example configuration of the hardware of a computer that performs the above described series of processes in accordance with a program.

In the computer, a central processing unit (CPU) 101, a read only memory (ROM) 102, a random access memory (RAM) 103, and an electronically erasable and programmable read only memory (EEPROM) 104 are connected to one another by a bus 105. An input/output interface 106 is further connected to the bus 105, so that the input/output interface 106 is connected to the outside.

In the computer having the above described configuration, the CPU 101 loads a program stored in the ROM 102 and the EEPROM 104 into the RAM 103 via the bus 105, for example, and executes the program, so that the above described series of processes are performed. Further, the program to be executed by the computer (the CPU 101) can not only be written beforehand in the ROM 102, but also be installed into the EEPROM 104 from the outside via the input/output interface 105 and be updated.

Further, in this specification, a system means an entire apparatus formed with a plurality of devices.

Note that the present technology may also be embodied in the configurations described below.

(1)

A vibration presentation device including:

a plurality of vibration units that vibrate when voltage is applied; and a control unit that controls vibration to be generated in the plurality of vibration units, in which the vibration units include a flexible, lightweight, and thin material, and are in surface contact with a portion to be presented with vibration.

(2)

The vibration presentation device according to (1), in which the control unit generates a vibration signal for each of the plurality of vibration units, and controls vibration for the plurality of vibration units independently of one another.

(3)

The vibration presentation device according to (1) or (2), in which the vibration units are formed with a laminated structure in which both surfaces of a dielectric layer that expands and contracts when voltage is applied thereto are interposed between electrodes.

(4)

The vibration presentation device according to any one of (1) to (3), in which the vibration units are formed with elastomer as a material.

(5)

The vibration presentation device according to any one of (1) to (4), in which the vibration units are formed in a tubular shape or a belt-like shape.

(6)

The vibration presentation device according to any one of (1) to (5), in which the plurality of vibration units are designed to be attached to and in contact with a plurality of portions of a hand of a user.

(7)

The vibration presentation device according to any one of (1) to (5), in which the plurality of vibration units are designed to be attached to and in contact with a plurality of portions of the body of a user.

(8)

The vibration presentation device according to any one of (1) to (5), in which the plurality of vibration units are attached to a plurality of portions of a seat belt of an automobile.

(9)

A vibration presentation method implemented by a vibration presentation device that includes:

a plurality of vibration units that vibrate when voltage is applied; and a control unit that controls vibration to be generated in the plurality of vibration units, the vibration units including a flexible, lightweight, and thin material, and being in surface contact with a portion to be presented with vibration, the vibration presentation method including the steps of:

generating a vibration signal for each of the plurality of vibration units; and controlling vibration for the plurality of vibration units independently of one another.

(10)
A program to be executed by a computer that controls a vibration presentation device that includes:
a plurality of vibration units that vibrate when voltage is applied; and
a control unit that controls vibration to be generated in the plurality of vibration units,
the vibration units including a flexible, lightweight, and thin material, and being in surface contact with a portion to be presented with vibration,
the program causing the computer to perform a process including the steps of:
generating a vibration signal for each of the plurality of vibration units; and
controlling vibration for the plurality of vibration units independently of one another.

Note that this embodiment is not limited to the above described embodiment, and various modifications may be made to it without departing from the scope of the present disclosure.

REFERENCE SIGNS LIST

11 Vibration actuator
12 Dielectric layer
13 and 14 Electrode
15 Power supply
16 Switch
17 and 18 Conductive wire
21 Vibration presentation device
22-1 through 22-6 Vibration actuator
23-1 and 23-2 Conductive wire
24 Control unit
31 Vibration presentation system
41 Content execution processing device
42 Host computer
43 Vibration data transmission unit
51 Vibration data reception unit
52 Vibration signal control unit
53-1 through 53-6 Vibration signal amplification unit

The invention claimed is:

1. A vibration presentation device, comprising:
a plurality of vibration units, wherein
each vibration unit of the plurality of vibration units includes a cylindrical surface and a flexible material,
each vibration unit of the plurality of vibration units surrounds a portion of a strap,
the plurality of vibration units includes a first vibration unit and a second vibration unit, and
the first vibration unit is spaced apart from the second vibration unit along a circumference of the strap, and
each vibration unit of the plurality of vibration units is configured to vibrate based on application of a voltage to the plurality of vibration units;
a control unit configured to generate a plurality of vibration signals; and
a plurality of amplification units, wherein
each amplification unit of the plurality of amplification units is associated with a corresponding vibration unit of the plurality of vibration units,
each amplification unit of the plurality of amplification units is configured to:
amplify a corresponding vibration signal of the plurality of vibration signals; and
transmit the amplified corresponding vibration signal to the corresponding vibration unit to control the vibration of the corresponding vibration unit,
and
each vibration unit of the plurality of vibration units is further configured to be in surface contact with a portion to be presented with the vibration.

2. The vibration presentation device according to claim 1, wherein
each vibration unit of the plurality of vibration units further includes a first electrode, a second electrode, and a dielectric layer between the first electrode and the second electrode,
the dielectric layer includes a first surface and a second surface, and
the first surface and the second surface of the dielectric layer are configured to expand and contract based on the application of the voltage.

3. The vibration presentation device according to claim 1, wherein each vibration unit of the plurality of vibration units includes elastomer as the flexible material.

4. The vibration presentation device according to claim 1, wherein each vibration unit of the plurality of vibration units has one of a tubular shape or a belt-like shape.

5. The vibration presentation device according to claim 1, wherein each vibration unit of the plurality of vibration units is further configured to be attached to and in contact with a plurality of portions of a body of a user.

6. The vibration presentation device according to claim 1, wherein the cylindrical surface is configured to be in contact with a body part of a user.

7. A vibration presentation method, comprising:
in a vibration presentation device that includes:
a plurality of vibration units, wherein
each vibration unit of the plurality of vibration units includes a cylindrical surface and a flexible material,
each vibration unit of the plurality of vibration units surrounds a portion of a strap,
the plurality of vibration units includes a first vibration unit and a second vibration unit, and
the first vibration unit is spaced apart from the second vibration unit along a circumference of the strap, and
each vibration unit of the plurality of vibration units is configured to vibrate based on application of a voltage to the plurality of vibration units;
a control unit; and
a plurality of amplification units, wherein
each vibration unit of the plurality of vibration units is configured to be in surface contact with a portion to be presented with the vibration, and
each amplification unit of the plurality of amplification units is associated with a corresponding vibration unit of the plurality of vibration units:
generating, by the control unit, a plurality of vibration signals;
amplifying, by each vibration unit of the plurality of amplification units, a corresponding vibration signal of the plurality of vibration signals; and
transmitting, by each amplification unit of the plurality of amplification units, the amplified corresponding vibration signal to the corresponding vibration unit for controlling the vibration of the corresponding vibration unit.

8. A non-transitory computer-readable medium having stored thereon computer-executable instructions that, when executed by a vibration presentation device, cause the vibration presentation device to execute operations, the operations comprising:

generating, by a control unit of the vibration presentation device, a plurality of vibration signals, wherein
the vibration presentation device includes a plurality of vibration units and a plurality of amplification units,
each vibration unit of the plurality of vibration units includes a cylindrical surface and a flexible material,
each vibration unit of the plurality of vibration units surrounds a portion of a strap,
the plurality of vibration units includes a first vibration unit and a second vibration unit, and
the first vibration unit is spaced apart from the second vibration unit along a circumference of the strap, and
each vibration unit of the plurality of vibration units is configured to vibrate based on application of a voltage to the plurality of vibration units,
each vibration unit of the plurality of vibration units is further configured to be in surface contact with a portion to be presented with the vibration, and
each amplification unit of the plurality of amplification units is associated with a corresponding vibration unit of the plurality of vibration units;
amplifying, by each amplification unit of the plurality of amplification units, a corresponding vibration signal of the plurality of vibration signals; and
transmitting, by each amplification unit of the plurality of amplification units, the amplified corresponding vibration signal to the corresponding vibration unit for controlling the vibration of the corresponding vibration unit.

\* \* \* \* \*